(12) United States Patent
Huang et al.

(10) Patent No.: US 8,796,542 B2
(45) Date of Patent: Aug. 5, 2014

(54) ENCAPSULANT MATERIAL, CRYSTALLINE SILICON PHOTOVOLTAIC MODULE AND THIN FILM PHOTOVOLTAIC MODULE

(75) Inventors: Lee-May Huang, Hsinchu (TW);
Cheng-Yu Peng, Taoyuan County (TW);
Wen-Chung Liang, Hsinchu (TW);
Chun-Heng Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 852 days.

(21) Appl. No.: 12/584,693

(22) Filed: Sep. 9, 2009

(65) Prior Publication Data

US 2010/0147363 A1    Jun. 17, 2010

(30) Foreign Application Priority Data

Dec. 12, 2008 (TW) ................ 97148637 A

(51) Int. Cl.
*H01L 31/052* (2014.01)
(52) U.S. Cl.
USPC ........... 136/259; 136/246; 136/251; 136/257; 136/258; 136/261
(58) Field of Classification Search
CPC .............. H01L 31/028; H01L 31/0481; H01L 31/0552; Y02E 10/545–10/547
USPC .......................... 136/246, 251, 256, 257, 259
See application file for complete search history.

(56) References Cited

U.S. PATENT DOCUMENTS

| 3,574,470 | A | * | 4/1971 | Paine et al. .................. 356/446 |
| 4,183,075 | A | * | 1/1980 | Hengst ............... 362/6 |
| 5,569,332 | A | | 10/1996 | Glatfelter et al. |
| 5,994,641 | A | | 11/1999 | Kardauskas |
| 6,586,271 | B2 | | 7/2003 | Hanoka |
| 2005/0172997 | A1 | | 8/2005 | Meier et al. |
| 2008/0000517 | A1 | | 1/2008 | Gonsiorawski et al. |
| 2008/0185033 | A1 | | 8/2008 | Kalejs |
| 2009/0178704 | A1 | * | 7/2009 | Kalejs et al. .................. 136/246 |

FOREIGN PATENT DOCUMENTS

| JP | 52085267 | 7/1977 |
| TW | 200521158 | 7/2005 |
| TW | 200534331 | 10/2005 |
| TW | 200538636 | 12/2005 |
| TW | I255314 | 5/2006 |
| TW | 200845405 | 11/2008 |
| WO | 2007013651 | 2/2007 |

OTHER PUBLICATIONS

E. Reverchon et al., "Production of controlled polymeric foams by supercritical $CO_2$" The Journal of Supercritical Fluids, vol. 40, 2007, pp. 144-152.

(Continued)

*Primary Examiner* — Thanh-Truc Trinh
(74) *Attorney, Agent, or Firm* — J.C. Patents

(57) ABSTRACT

An encapsulant material with enhanced light reflectivity, a crystalline silicon photovoltaic module and a thin film photovoltaic module are provided. The encapsulant material has a porous structure therein, and an average pore diameter of the porous structure is between several hundreds of nanometers and several hundreds of micrometers, so that the light reflectance of the encapsulant material is improved. Moreover, the encapsulant material is crosslinked by a physical or chemical crosslinking method, so heat resistance thereof is improved. Therefore, the encapsulant material is suitable for the crystalline silicon photovoltaic module and the thin film photovoltaic module, so as to increase power conversion efficiency of these modules.

17 Claims, 21 Drawing Sheets

(56) References Cited

OTHER PUBLICATIONS

Zhi-Mei Xu et al., "Foaming f polypropylene with supercritical carbon dioxide" The Journal of Supercritical Fluids, vol. 41, 2007, pp. 299-310.

"First Office Action of China Counterpart Application", issued on Jul. 26, 2011, p. 1-p. 3, in which the listed reference was cited.

"Office Action of Taiwan Counterpart Application", issued on Dec. 22, 2012, p. 1-p. 7, in which the listed TW200845405, TW200521158, TWI255314, TW200538636, and TW200534331 were cited.

"Third Office Action of China Counterpart Application", issued on Dec. 5, 2012, p. 1-p. 6, in which the listed 20080185033, and JP52085267 were cited.

* cited by examiner

ENCAPSULANT MATERIAL, CRYSTALLINE SILICON PHOTOVOLTAIC MODULE AND THIN FILM PHOTOVOLTAIC MODULE

CROSS-REFERENCE TO RELATED APPLICATION

This application claims the priority benefit of Taiwan application serial no. 97148637, filed on Dec. 12, 2008. The entirety of the above-mentioned patent application is hereby incorporated by reference herein and made a part of this specification.

BACKGROUND OF THE INVENTION

1. Field of the Invention

The present invention relates to an encapsulant material having enhanced light reflectivity, to a crystalline silicon photovoltaic module and to a thin film photovoltaic module.

2. Description of Related Art

A structure of a photovoltaic module includes a frontsheet, solar cells and a backsheet formed in a laminated sandwiched structure. An encapsulant material therein is mainly used as a barrier layer to protect the solar cells and connecting circuits in the photovoltaic module from environmental hazards like moisture, oxygen, acid rain and salts. A good encapsulant material not only extends life span of the module, but also maintains a certain photovoltaic conversion efficiency.

Common encapsulant materials are highly transparent thermosetting or thermoplastic polymeric materials. Since refraction coefficients (n) of the encapsulant materials are similar to that of glass, it is uncommon to directly use the encapsulant materials to enhance light trapping of the photovoltaic module. A most common example is using periodical V-groove structures disposed between the frontsheet and the backsheet of the photovoltaic module and in the interspace between the solar cells to enhance light reflectivity of a crystalline silicon photovoltaic module.

As shown in a patent layout strategic analysis of the photovoltaic modules, most patents focus on development of materials and processing technologies of the modules, and each of the companies emphasizes on highly transparent optical elements: for example solar cells with anti-reflection layer, glass substrate with texturing on its surface; another emphasis is on highly reflective backsheet, and few patents focus on structural designs of light trapping of encapsulant material of the module, thereby effectively confining sunlight in the structure of the photovoltaic module.

Relating to structural designs of high transparency optical elements and backsheets, in U.S. Pat. No. 5,994,641, the V-groove textured sheet that exposes to sunlight are disposed in the gaps between solar cell arrays, thereby being fabricated into a highly reflective optical sheet and effectively enhances light trapping and use thereof. In comparison, the present invention uses an encapsulant material with enhanced light reflectivity to devise the light reflecting and scattering properties of gaps in an array, thereby effectively improving light trapping of the gaps between solar cells.

US Patent Publication No. 2008/0000517 A1 provides a design of a highly reflective backsheet having a structure with embossed surfaces, which guides light obliquely to produce backsheet reflectivity. In comparison, the present invention uses an encapsulant material with enhanced light reflectivity, thereby using the encapsulant material to generate a condition in which scattering angle of the reflected light is greater than a critical angle, so that the sunlight is totally reflected back from the surface of the front sheet thereby, the photoenergy is effectively trapped inside the module.

The light trapping in the thin film photovoltaic module mainly uses back electrode metallic films or white paint as back surface reflectors to enhance light absorption of the photo active layer, for example in U.S. Pat. No. 5,569,332. However, the above method is unfavorable for applications in see-through type thin film photovoltaic module.

SUMMARY OF THE INVENTION

Therefore, the present invention provides a novel structure of an encapsulant material for a photovoltaic module, which has porous structure of several hundreds of nanometers to several hundreds of micrometers to enhance light reflectivity inside the encapsulant, so as to improve the light trapping of, for example 1) crystalline silicon photovoltaic module and 2) thin film photovoltaic module.

The photovoltaic modules of the present invention include a single layer or multi layers structured encapsulant material having porous microscopic structure with high reflectivity, which has a light confining characteristic, so as to effectively trap sunlight inside the photovoltaic module, resulting in an enhancement of power conversion efficiency.

First, the present invention provides an encapsulant material with enhanced light reflectivity, which is characterized by a porous structure in the encapsulant material. An average pore diameter of the porous structure is between several hundreds of nanometers and several hundreds of micrometers, so as to improve reflectivity of the encapsulant material. The encapsulant material is further crosslinked by a chemical or physical crosslinking method, so as to improve its heat resistance.

The present invention further provides a crystalline silicon photovoltaic module which includes a first backsheet, a first encapsulant layer, a plurality of crystalline silicon solar cells, a second encapsulant layer and a transparent substrate sequentially stacked. The crystalline silicon photovoltaic module further includes an encapsulant material with porous structure disposed between the backsheet and the transparent substrate (i.e. the frontsheet), so as to collect light passing through the gap between the crystalline silicon solar cells and to increase power conversion efficiency of the crystalline silicon photovoltaic module.

The present invention further provides a thin film photovoltaic module which includes a backsheet, a back electrode transparent conductive layer, a thin film solar cell, a transparent conductive layer and a transparent substrate. The thin film photovoltaic module further includes an encapsulant material with porous structure disposed between the backsheet and the back electrode transparent conductive layer, so as to enhance light absorption in the thin film solar cell, thereby increasing the power conversion efficiency of the thin film photovoltaic module. According to embodiments of the present invention, reflectance of the encapsulant material with porous structure is, for example, between 7% and 45%.

In the present invention, the reflectivity characteristics of the encapsulant material having porous structure is utilized to improve light trapping of the photovoltaic module and to further enhance power conversion efficiency of the photovoltaic module. In addition, since the encapsulant material of the present invention is transparent, it may be applied to building integrated photovoltaic (BIPV) crystalline silicon photovoltaic modules and see-through type thin film photovoltaic modules. For example, the encapsulant material of the present invention may be disposed between the frontsheet and the backsheet of the crystalline silicon solar cell, so when the crystalline silicon solar cell is irradiated by sunlight, the encapsulant material with porous structure will generate reflectivity, thereby enhancing photovoltaic conversion efficiency of the crystalline silicon photovoltaic module. When applying the encapsulant material of the present invention on the see-through type thin film photovoltaic module, a light path passing through the back electrode transparent conductive layer may be lengthened, and the light absorption in the thin film solar cells is increased.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In the present invention, an encapsulant material with enhanced reflectivity is a material obtained with a supercritical $CO_2$ foaming method, wherein the encapsulant material has porous structure, and an average pore diameter in the porous structure ranges between several hundreds of nanometers to several hundreds of micrometers, thereby enhancing light reflectivity of the encapsulant material; for example, enhancing reflectance to 7-45%.

Moreover, the encapsulant material having porous structure is crosslinked by a chemical or physical crosslinking method, so as to enhance its heat resistance. For example, the chemical crosslinking method may be peroxide or silane crosslinking, as referred to U.S. Pat. No. 4,714,716 and U.S. Pat. No. 6,900,267. The physical crosslinking method is, for example, e-beam or gamma ray crosslinking.

The encapsulant material is, for example, EVA, PVB, polyolefin, polyurethane (PU) and silicone.

Different encapsulant materials exhibit different porous structures and sizes after foaming, so that different level of effects are displayed. For example, after foaming, the reflectance range of PVB polymer material is from 15% to 45%, and the reflectance range of EVA polymer material is from 7% to 45%.

Figure 8:
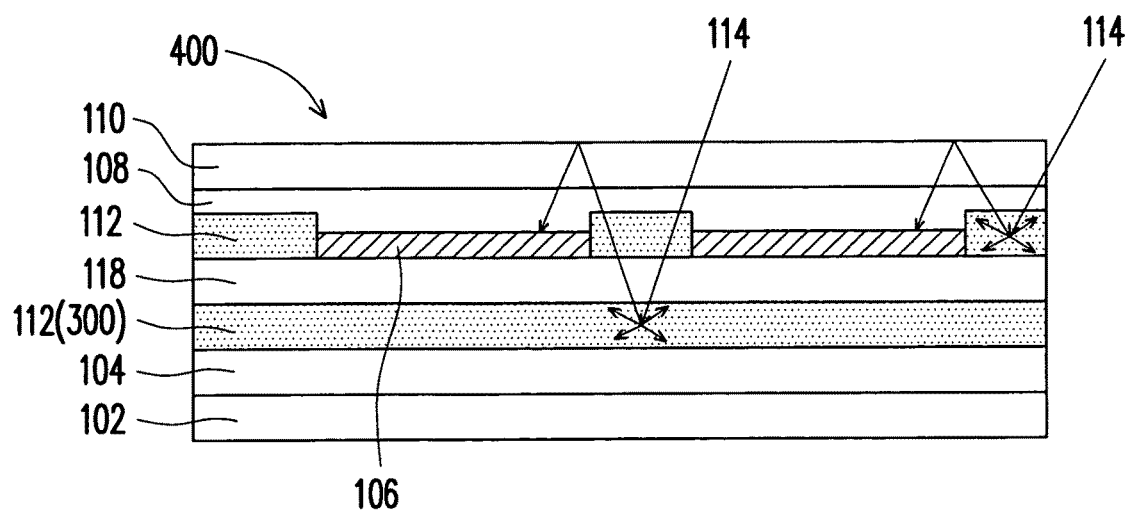
FIG. 8 is a schematic cross-sectional view showing a crystalline silicon photovoltaic module according to the fifth embodiment of the present invention.
Figure 9:
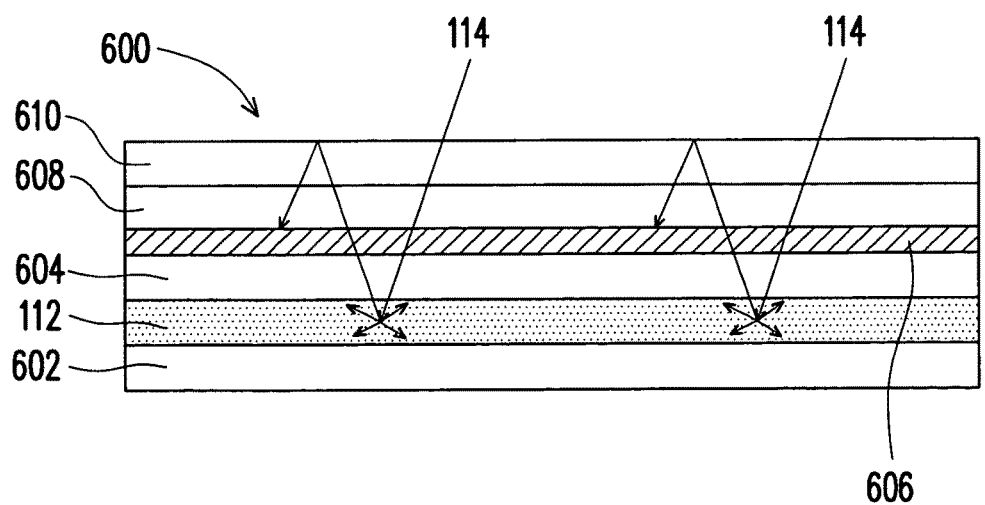
FIG. 9 is a schematic cross-sectional view showing a thin film photovoltaic module according to the sixth embodiment of the present invention.
Figure 10:
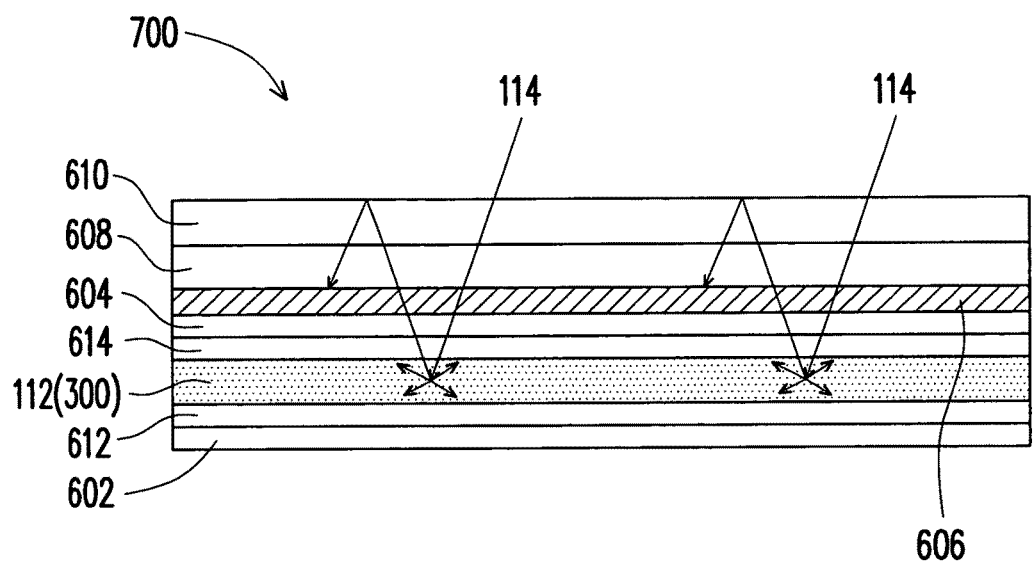
FIG. 10 is a schematic cross-sectional view showing a thin film photovoltaic module according to the seventh embodiment of the present invention.

The encapsulant material having porous structure that enhances reflectivity of the present invention has high reflectance and transmittance, so it may be applied to various forms of crystalline silicon photovoltaic modules (such as shown in FIGS. 1 to 8) or to thin film photovoltaic modules (such as shown in FIGS. 9 and 10).

First Embodiment

Figure 1:
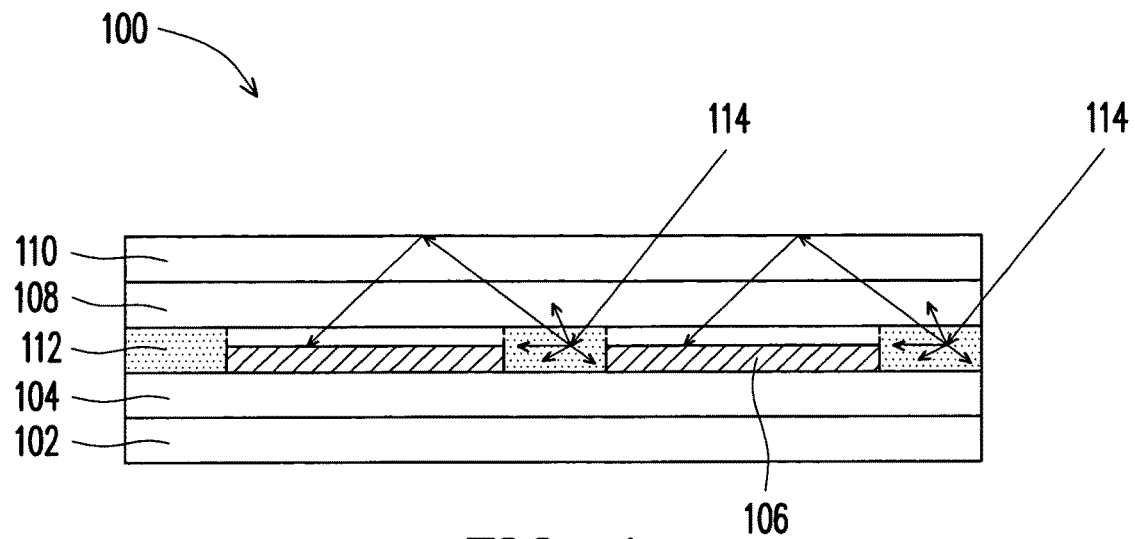
FIG. 1 is a schematic cross-sectional view showing a crystalline silicon photovoltaic module according to the first embodiment of the present invention.

FIG. 1 is a schematic cross-sectional view showing a crystalline silicon photovoltaic module according to the first embodiment of the present invention.

Referring to FIG. 1, a crystalline silicon photovoltaic module 100 according to the first embodiment includes a first backsheet 102, a first encapsulant layer 104, a plurality of crystalline silicon solar cells 106, a second encapsulant layer 108 and a transparent substrate 110 sequentially stacked. The crystalline silicon photovoltaic module 100 further includes an encapsulant material with porous structure 112 disposed between the crystalline silicon solar cells 106 and between the first encapsulant layer 104 and the second encapsulant layer 108 to collect light passing through the crystalline silicon solar cells 106 and to enhance power conversion efficiency of the crystalline silicon photovoltaic module 100. An average pore diameter in the encapsulant material with porous structure 112 is between several hundreds of nanometers and several hundreds of micrometers, and a film thickness of the encapsulant material with porous structure 112 is, for example, between 0.1 mm to 1 mm. The first encapsulant layer 104 and the second encapsulant layer 108 may be encapsulating materials conventionally used in photovoltaic modules, such as poreless EVA, PVB, polyolefin, PU or silicone.

The backsheet 102 is, for example, a glass or a laminated polymer film, such as Tedlar®, and the transparent substrate 110 is, for example, glass or a plastic substrate.

According to the first embodiment, in a process of encapsulating the crystalline silicon photovoltaic module 100, the crystalline silicon solar cells 106 are usually disposed in arrays, and a laminating process is performed using a vacuum heating apparatus. The first encapsulant layer 104 and the second encapsulant layer 108 are melted and molded to completely surrounds the crystalline silicon solar cells 106. The encapsulant material having porous structure has preliminarily been crosslinked by an e-beam technology and has better heat resistance, so that the geometry of the encapsulant material with porous structure 112 is preserved after heating. The light trapping improvement using the reflectance characteristic of the encapsulant material with porous structure 112, thereby further enhancing power conversion efficiency of the module.

Since each of the crystalline silicon solar cells 106 of the crystalline silicon photovoltaic module 100 has very low output power, they must be serially connected to enhance power conversion efficiency. The crystalline silicon photovoltaic module 100 usually includes a plurality of "strings". A single string includes the plurality of serially connected crystalline silicon solar cells 106, and the respective strings are then parallelly connected to each other. A design principle of serial connection and parallel connection is according to a voltage and current requirement for the crystalline silicon photovoltaic module 100. However, in practice an effective area for electricity generation of the crystalline silicon photovoltaic module 100 is actually less than an irradiated area of the whole module. This is mainly because the adjacent crystalline silicon solar cells do not contact each other. An interval is preserved between the crystalline silicon solar cells 106 and near the edges of the crystalline silicon photovoltaic module 100 to reduce the deleterious effect of the environment.

Figure 2:
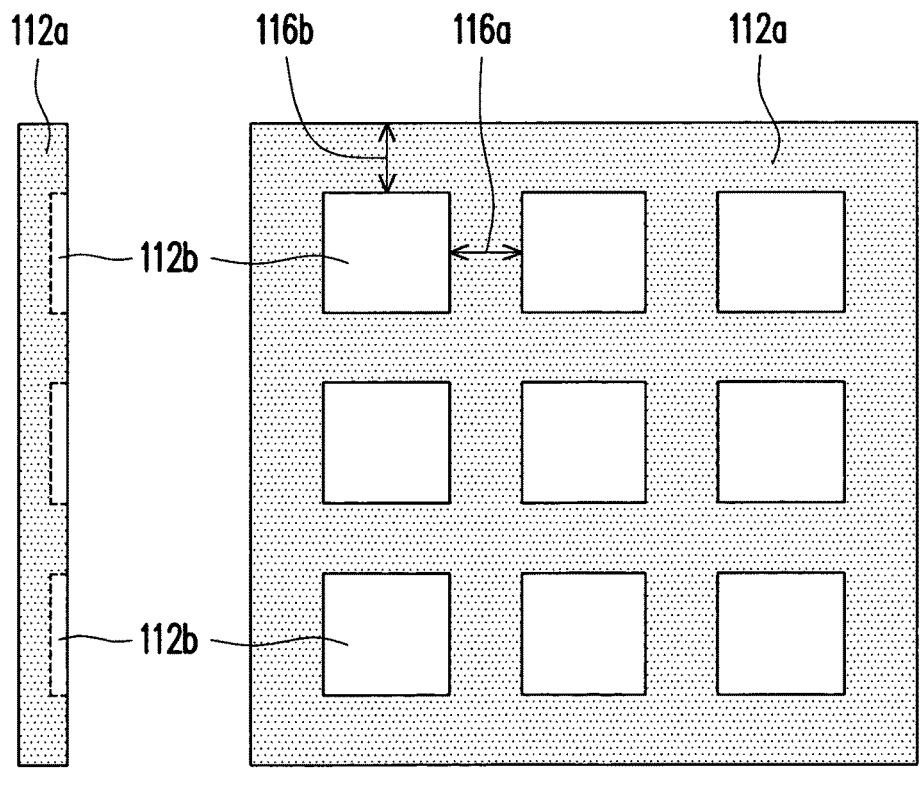
FIG. 2 is a diagram showing an encapsulant material having porous structure of FIG. 1 crosslinked by an e-beam.

According to the first embodiment, the encapsulant material with porous structure 112 may be crosslinked at different positions according to different irradiating intensity of e-beam. Referring to FIG. 2, part (1) and part (2) are respectively a cross-sectional view and a top view of the encapsulant material with porous structure 112 in FIG. 1 before encapsulation. During the e-beam crosslinking, a part of the areas is intentionally blocked so that an array area 112b is not irradiated by the e-beam, and only another area 112a is irradiated. When the encapsulant material with porous structure 112 is used in an arrangement as shown in FIG. 1 to encapsulate the photovoltaic module, since the area 112a is crosslinked and its heat resistance thereof is enhanced, it will not melt during subsequent heating process; only the area 112b is melted. Hence, if the array area crosslinked by the e-beam is designed to have the same size as the crystalline silicon solar cells 106 (referring to FIG. 1) and the gap 116a and the edge 116b is designed according to the gaps of the actual crystalline silicon photovoltaic module, the encapsulant material with porous structure partially crosslinked in FIG. 2 may replace the conventional encapsulant material. After lamination process, the structure of the crystalline silicon solar cell module is as shown in FIG. 1.

Therefore, by using the encapsulant material with porous structure 112 according to the first embodiment to fill the gaps between the crystalline silicon solar cells 106, light passing through the crystalline silicon solar cells 106 is effectively trapped. When irradiated by sunlight, since light 114 is reflected in all directions by the encapsulant material with porous structure 112, a part of the light is reflected to a surface of the crystalline silicon photovoltaic module 100 and is further absorbed by the crystalline silicon solar cells 106.

Figure 3:
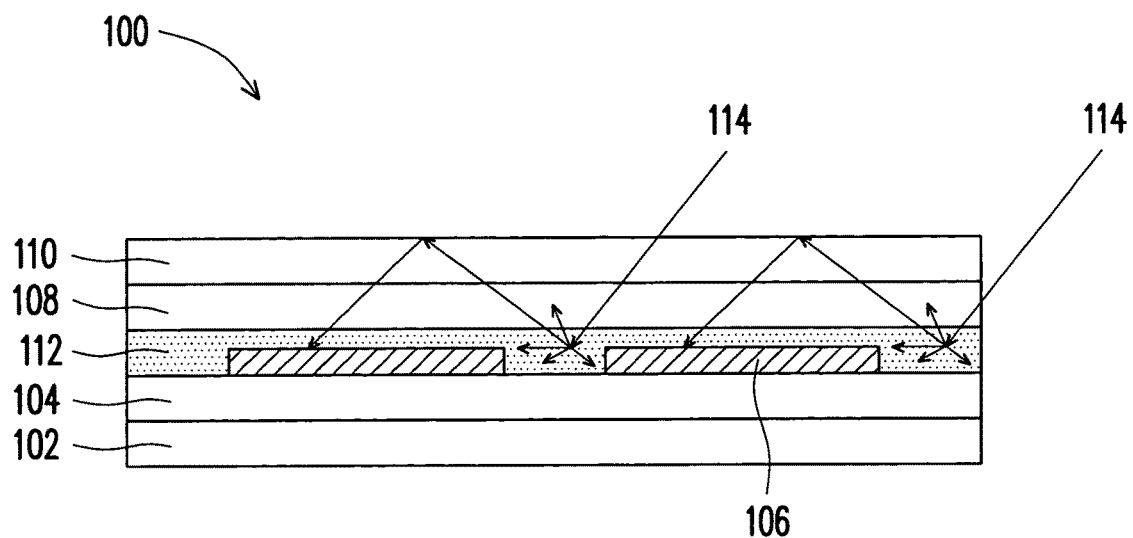
FIG. 3 is a schematic cross-sectional view showing another crystalline silicon photovoltaic module according to the first embodiment of the present invention.

In addition, since the encapsulant material with porous structure 112 has an average pore diameter between several hundreds of nanometers to several hundreds of micrometers, it not only has high reflectance but also high transmittance, so it may be applied to a see-through type crystalline silicon photovoltaic module, it may directly cover the crystalline silicon solar cells 106, referring to FIG. 3.

Second Embodiment

Figure 4:
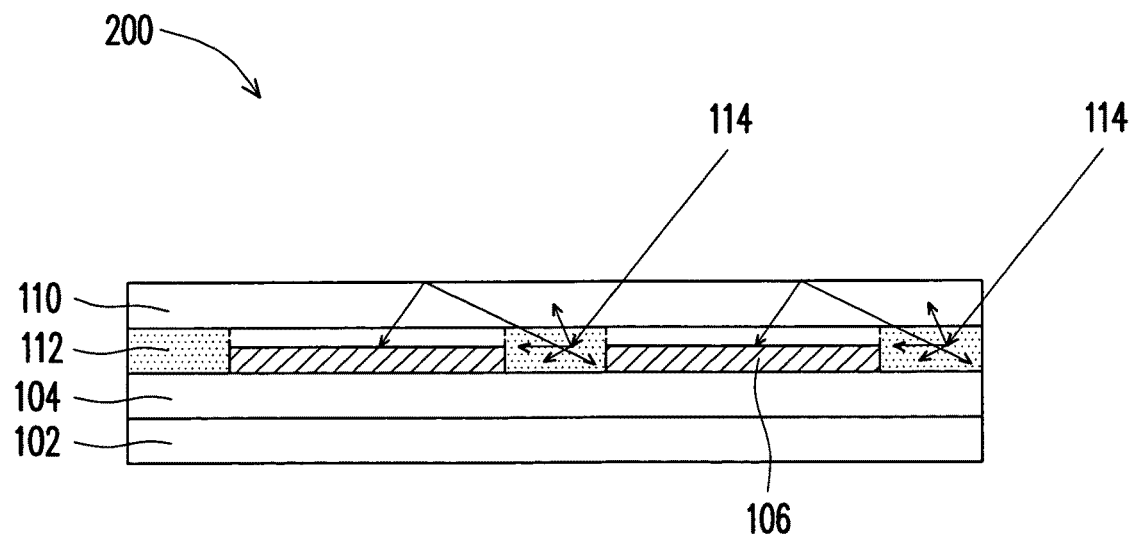
FIG. 4 is a schematic cross-sectional view showing a crystalline silicon photovoltaic module according to the second embodiment of the present invention.

FIG. 4 is a schematic cross-sectional view showing a crystalline silicon photovoltaic module according to the second embodiment of the present invention. The same reference numerals as those according to the first embodiment are used to represent the same components. According to the second embodiment, a crystalline silicon photovoltaic module 200 includes a first backsheet 102, a first encapsulant layer 104, a plurality of crystalline silicon solar cells 106 and a transparent substrate 110 sequentially stacked. The crystalline silicon photovoltaic module 200 further includes an encapsulant material with porous structure 112 disposed between the crystalline silicon solar cells 106 and between the first encapsulant layer 104 and the transparent substrate 110, thereby replacing the second encapsulant layer according to the first embodiment, so as to collect light passing throughpassing through the crystalline silicon solar cells 106 and to enhance power conversion efficiency of the crystalline silicon photovoltaic module 200.

Third Embodiment

Figure 5:
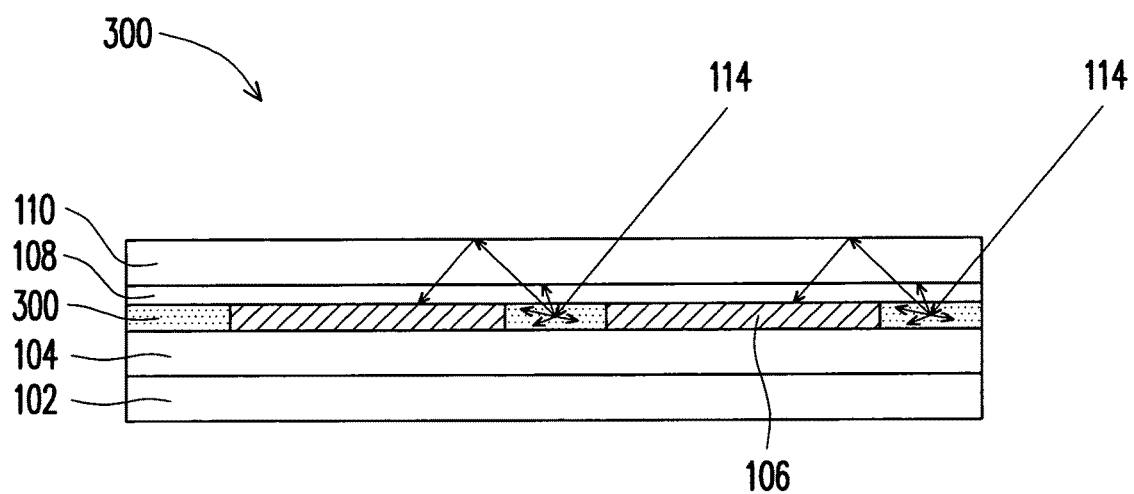
FIG. 5 is a schematic cross-sectional view showing a crystalline silicon photovoltaic module according to the third embodiment of the present invention.

FIG. 5 is a schematic cross-sectional view showing a crystalline silicon photovoltaic module according to the third embodiment of the present invention. The same reference numerals as those according to the first embodiment are used to represent the same components.

According to the third embodiment, in a crystalline silicon photovoltaic module 300, a plastic thin film structure 300 is disposed between the crystalline silicon solar cells 106 and between the first encapsulant layer 104 and the second encapsulant layer 108. The plastic thin film structure 300 may be a foamable polymeric material with high glass transition temperatures, and is disposed using an additional stacking method between the crystalline silicon solar cells 106 and between the first encapsulant layer 104 and the second encapsulant layer 108.

Fourth Embodiment

Figure 6:
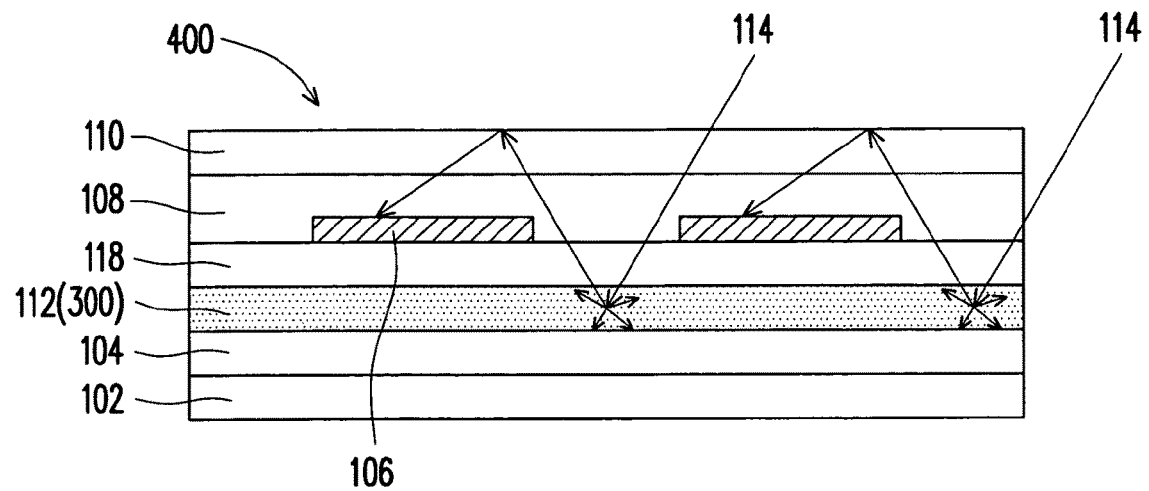
FIG. 6 is a schematic cross-sectional view showing a crystalline silicon photovoltaic module according to the fourth embodiment of the present invention.
Figure 7:
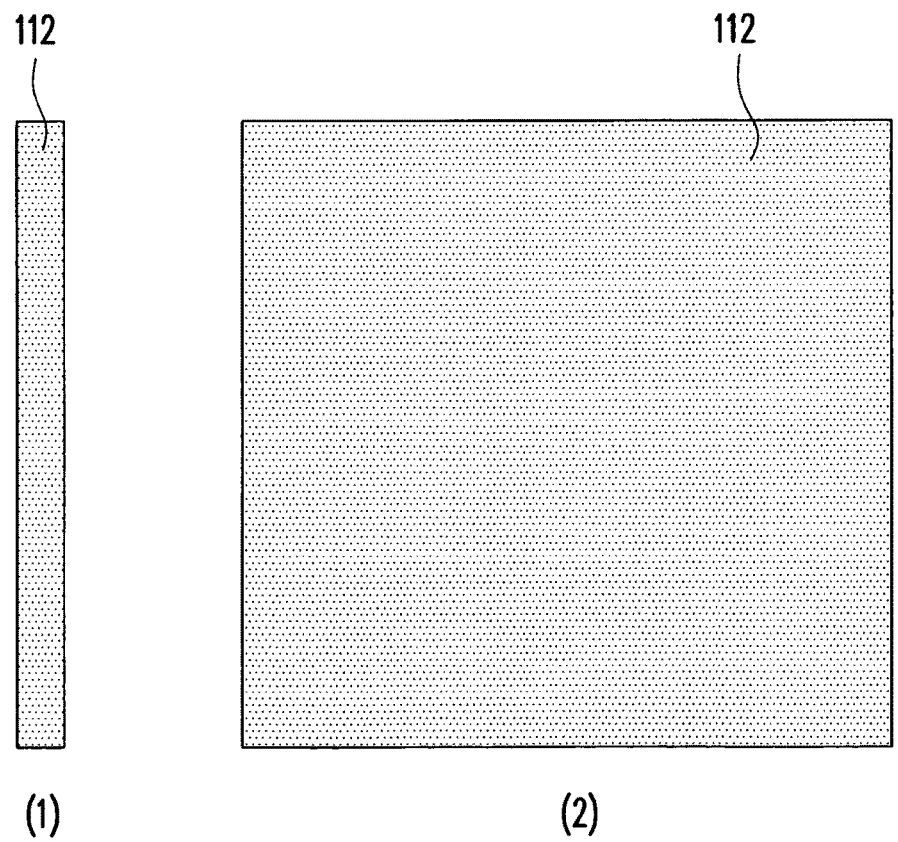
FIG. 7 is a diagram showing an encapsulant material with porous structure of FIG. 6 crosslinked by an e-beam.

FIG. 6 is a schematic cross-sectional view showing a crystalline silicon photovoltaic module according to the fourth embodiment of the present invention. The same reference numerals as those according to the first embodiment are used to represent the same components. Referring to FIG. 6, a crystalline silicon photovoltaic module 400 according to the present embodiment further includes a third encapsulant layer 118 disposed between the first encapsulant layer 104 and the plurality of crystalline silicon solar cells 106. The encapsulant material with porous structure 112 or the plastic thin film structure 300 is disposed between the third encapsulant layer 118 and the first encapsulant layer 104. Moreover, according to the present embodiment, after the encapsulant material with porous structure 112 is crosslinked using the e-beam, referring to FIG. 7, the (1) part and the (2) part are respectively the cross-sectional view and the top view of the encapsulant material with porous structure 112, referring to FIG. 6. The heat resistance of the crosslinked encapsulant material 112 is enhanced, and the crosslinked encapsulant material 112 can trap sunlight passing through the gaps between the crystalline silicon solar cells 106 and increase power conversion efficiency of the crystalline silicon photovoltaic module 400.

Fifth Embodiment

FIG. 8 is a schematic cross-sectional view showing a crystalline silicon photovoltaic module according to the fifth embodiment of the present invention. Same reference numerals as those according to the fourth embodiment are used to represent same components. A difference between the fifth embodiment and the fourth embodiment is that the encapsulant material with porous structure 112 or the plastic thin film structure 300 are respectively disposed at the third encapsulant layer 118 and at the first encapsulant layer 104 and are respectively disposed between the crystalline silicon solar cells 106 and between the third encapsulant layer 118 and the second encapsulant layer 108.

Sixth Embodiment

FIG. 9 is a schematic cross-sectional view showing a thin film photovoltaic module according to the sixth embodiment of the present invention. The same reference numerals as those according to the first embodiment are used to represent the same components.

Referring to FIG. 9, a thin film photovoltaic module 600 according to the sixth embodiment includes a backsheet 602, a back electrode transparent conductive layer 604, thin film solar cells 606, a transparent conductive layer 608 and a transparent substrate 610 sequentially stacked, wherein the back electrode transparent conductive layer 604, the thin film solar cells 606 and the transparent conductive layer 608 compose a so-called thin film solar photovoltaic component. The encapsulant material with porous structure 112 may be disposed between the backsheet 602 and the back electrode transparent conductive layer 604, so as to effectively enhance light absorption of the intrinsic layer of the thin film solar cells 606, thereby increasing power conversion efficiency of the thin film photovoltaic module 600. The backsheet 602 is, for example, a glass and a laminated polymer film, such as Tedlar®, and the transparent substrate 610 is, for example, glass or a plastic substrate. The thin film solar cells 606 of the present invention may be superstrate silicon thin film solar cells, superstrate copper indium gallium selenide (CIGS) thin film solar cells or superstrate cadmium telluride (CdTe) thin film solar cells.

According to the sixth embodiment, when the thin film solar cells 606 are silicon thin film solar cells, they may be a-Si (amorphous silicon) having absoption wavelengths shorter than 700 nm, µc-Si (micro-crystal silicon) having absoption wavelengths extending to infrared areas of 1100 nm, tandem junction silicon thin films or triple junction silicon thin films that absorb light of long wavelengths. Due to reflectance characteristics of the encapsulant material 112, a light path is extended and internal reflectance is enhanced during irradiation of light 114, so that light absorption in the thin film solar cells 606 are increased.

When the thin film photovoltaic module 600 is irradiated by the light 114 and an angle incident on the encapsulant material 112 is larger than the threshold angle, all light 114 is reflected to a surface of the thin film solar cells 606 and are further absorbed. Moreover, since the encapsulant material with porous structure 112 has light transmittance between 55% and 93%, it may be applied to see-through type thin film photovoltaic modules.

Seventh Embodiment

FIG. 10 is a schematic cross-sectional view showing a thin film photovoltaic module according to the seventh embodiment of the present invention The same reference numerals as those according to the sixth embodiment are used to represent the same components. In a thin film photovoltaic module 700 according to the present invention, the encapsulant material with porous structure 112 or the plastic thin film structure 300 may be disposed in an additional stacking method between a first encapsulant layer 612 and a second encapsulant layer 614.

Eighth Embodiment

Figure 11:
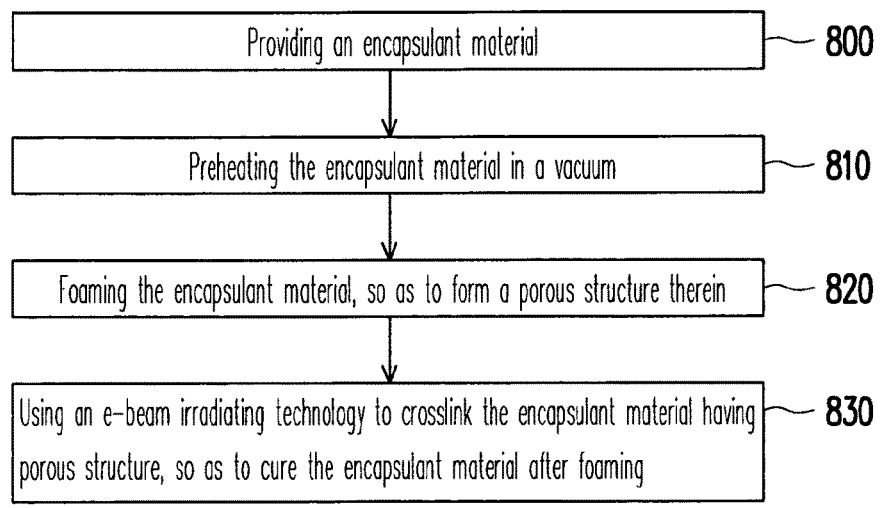
FIG. 11 is a manufacturing flowchart of an encapsulant material with enhanced light reflectivity according to the eighth embodiment of the present invention.

FIG. 11 is a manufacturing flowchart of an encapsulant material with enhanced light reflectivity according to the eighth embodiment of the present invention.

Referring to FIG. 11, first a step 800 is performed; an encapsulant material is provided. The encapsulant material is, for example, polymeric materials such as EVA, PVB, polyolefin, PU or silicone. A method for preparing the encapsulant material may be performed by using common polymer synthesis technologies or by directly purchasing commercial products.

Then, a step 810 is performed; the encapsulant material is preheated in a vacuum to eliminate the surface texture. A method of preheating the encapsulant material in vacuum is, for example, by melting a polymer material at a temperature higher than its melting point, so the temperature for preheating needs to be controlled at over 100° C., preferably between 120° C. and 160° C., and reduces pressure up to 760 mmHg using vacuum pump. The dwell time for heating in the vacuum is, for example, between 5 minutes and 1 hour.

After the step 810, a step 820 is performed. The encapsulant material is foamed, so that a porous structure is formed therein, thereby completing the encapsulant material with enhanced light reflectivity according to the eighth embodiment. The method for foaming is, for example, a supercritical $CO_2$ foaming method. The average pore diameter obtained by foaming is about several hundreds of nanometers to several hundreds of micrometers.

In addition, according to the eighth embodiment, after the step 820, an e-beam irradiating technology may be applied in order to cure the encapsulant material having porous structure after foaming (as in a step 830).

The following exemplifies a plurality of experiments to demonstrate efficacy of the present invention.

Experiment One

PVB is used as a polymer material. First it is preheated at about 100° C. to 160° C. in the vacuum for 15 to 30 minutes. Then, the supercritical $CO_2$ foaming method is adopted, wherein the method is a continuous or batch soaking of PVB film in $CO_2$ under saturated pressure and saturated temperature conditions ($T_{c,\,CO2}$=31° C. and $P_{c,\,CO2}$=7.38 Mpa). The PVB is soaked under a pressure of 10 to 25 Mpa at a temperature of 40 to 80° C. for 1 to 10 minutes, depending on sample thickness. Thermodynamic instability caused during a depressurization step causes the matrix of the polymeric material to be dissolved by the supersaturated $CO_2$, thereby cells nucleation occur. The so-called nucleation of cells may be defects in a polymer matrix or intentionally added nucleating agents. At this point, $CO_2$ molecules begin generating small pores, which gradually grow into larger pores. A size of the nucleation of cells continues to grow until a specific temperature is reached. The size distribution and number of the nucleation of cells depend on the saturated temperature, the saturated pressure and a depressurization speed, for example as in "Foaming of Polypropylene with Supercritical Carbon Dioxide" on pages 299 to 310 of the *Journal of Supercritical Fluids*, 41, 2007 or as in "Production of Controlled Polymeric Foams by Supercritical $CO_2$" on pages 144 to 152 of the *Journal of Supercritical Fluids*, 40, 2007.

Figure 12:
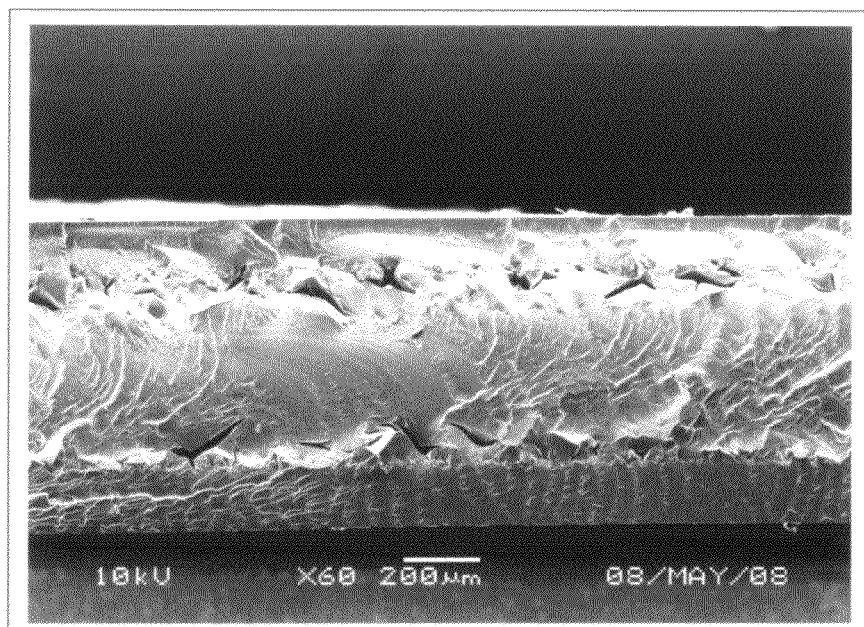
FIG. 12 is a SEM (scanning electron microscope) photograph of polyvinyl butyral (PVB) having porous structure inside obtained in experiment one.

FIG. 12 is a SEM photograph of PVB having porous structure obtained in experiment one. Referring to FIG. 12, the porous structure may be observed as having a V shape and the pores being located near top and bottom surfaces of the PVB film.

Figure 13:
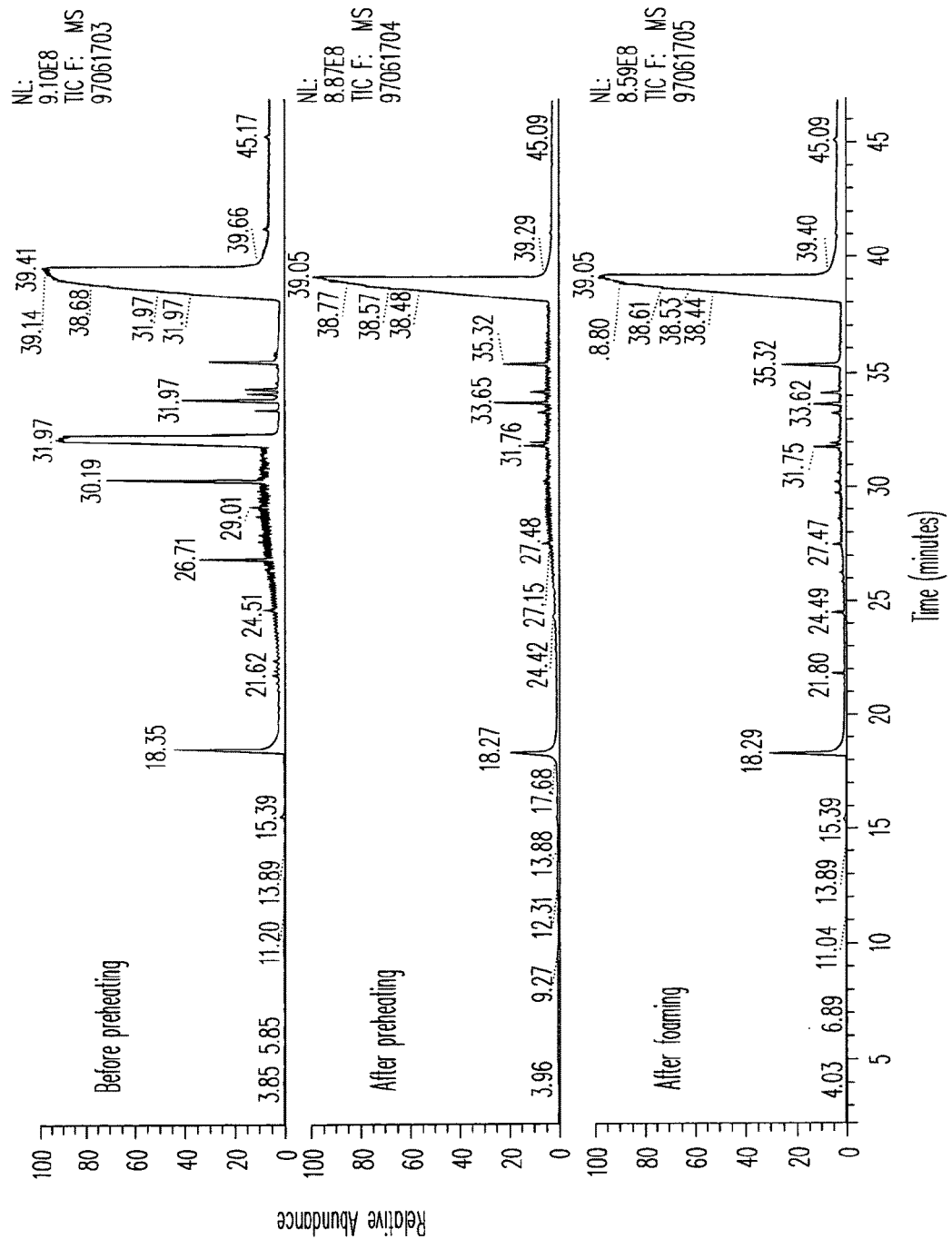
FIG. 13 is a GPC-MS curve of PVB before preheating, after preheating and after foaming.

Moreover, changes in composition of the PVB before and after preheating steps in the vacuum and after $CO_2$ foaming may be analyzed to obtain FIG. 13 using pyrolysis gas chromatography/mass spectroscopy (GC/MS).

Generally during synthesis and processing of polymers, different additives are often added to tune the polymers properties. The pyrolysis GC/MS method is used to analyze changes in mass spectra of the PVB before and after heating in the vacuum steps and after foaming step. First the PVB sample is heated to disintegrate for 4 second using a disintegrating device, wherein a temperature is set at 255° C.; then the disintegrated product is injected into a gas chromatography column to separate different components in the mixture, as the sample travels along the length of the column. Each compositions take different amounts of time to elute from the gas chromatograph. Then the compositions and types of additives of the PVB material polymer is determined according to the dwell time. Referring to FIG. 13, it may be known that a GPC/MS curve of the PVB changes significantly before and after preheating steps in the vacuum, thereby it is inferred that a part of a plasticizer is removed. The duration in the vacuum and foaming steps affect the porous structure of the PVB, thereby indirectly affecting reflectance characteristics of the polymer material.

Figure 14:
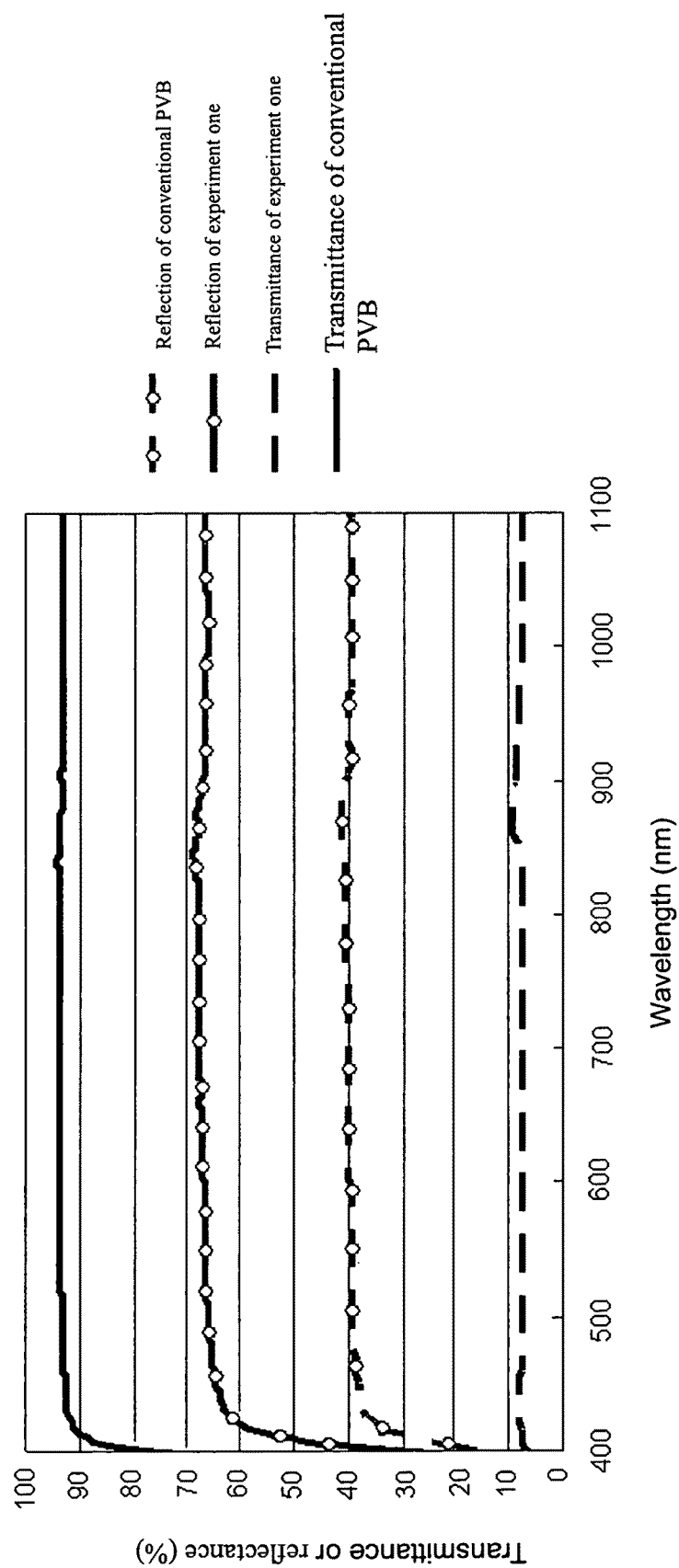
FIG. 14 is a curve showing reflectance and transmittance of PVB having porous structure obtained in experiment one and of conventional PVB.

FIG. 14 is a curve showing reflectance and transmittance of the PVB having porous structure obtained in experiment one and that of conventional poreless PVB Referring to FIG. 14, it is known that the PVB of the present invention maintains a light transmittance of about 60% to 70% and has a reflectance up to about 40%, which is much higher than a reflectance of 6% to 8% of the conventional poreless PVB, so the PVB of the present invention may be used as the encapsulant material with enhanced reflectivity.

Figure 15:
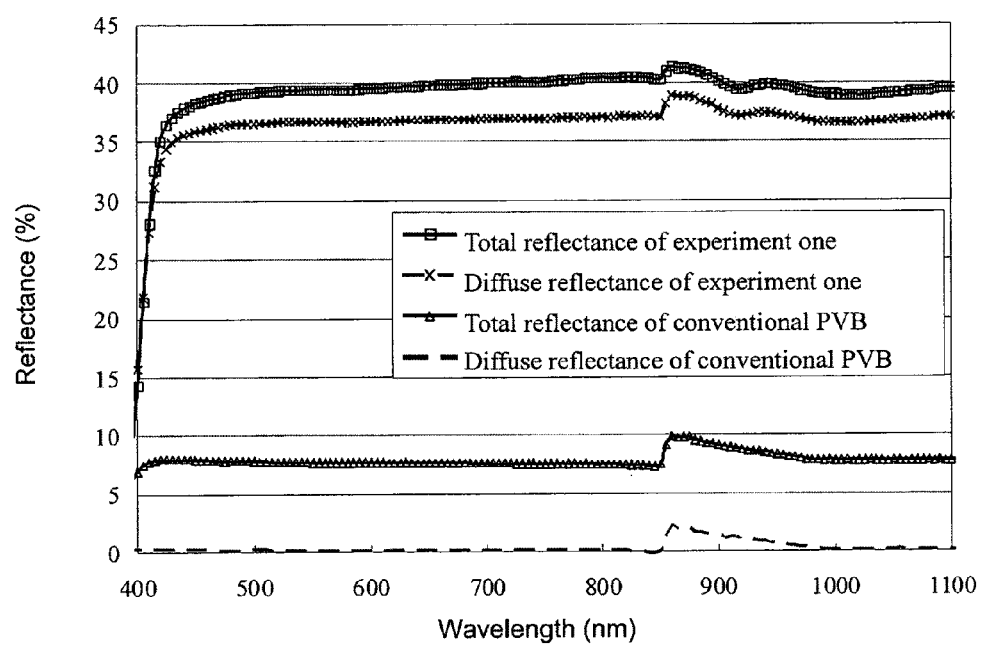
FIG. 15 is a curve showing diffuse reflectance and total reflectance of PVB having porous structure obtained in experiment one and of conventional PVB.

Referring to FIG. 15, the high reflectance characteristic of the PVB with porous structure obtained in experiment one mainly contributes to diffuses reflectance, while the conventional PVB does not have an effect on diffuse reflectance.

Experiment Two

As shown in the crystalline silicon photovoltaic module in FIG. 1, the effects of the reflectance characteristics of the conventional poreless encapsulant material and that of the encapsulant material with porous structure on the power conversion efficiency of the crystalline silicon photovoltaic module is compared. Under a condition in which an interface between air outside the crystalline silicon photovoltaic module 100 and the transparent substrate 110 and an interface between the second encapsulant layer 108 and the transparent substrate 110 are the same in both poreless and porous cases, the second encapsulant layer 108 and the transparent substrate 110 may be omitted, and the effects of the encapsulant material 112 on light trapping of the crystalline silicon photovoltaic module 100 is directly evaluated.

Figure 16:
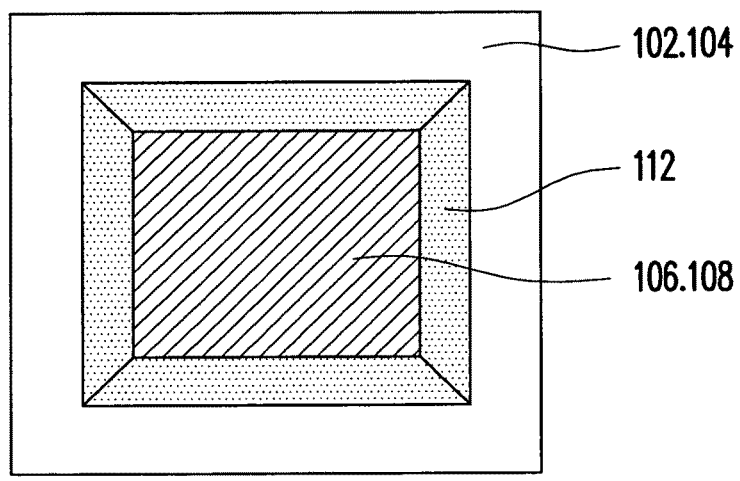
FIG. 16 is a schematic diagram showing an encapsulant stacking method of a PVB encapsulant material having porous structure and a single-piece crystalline silicon solar cell according to experiment two.
Figure 17A:
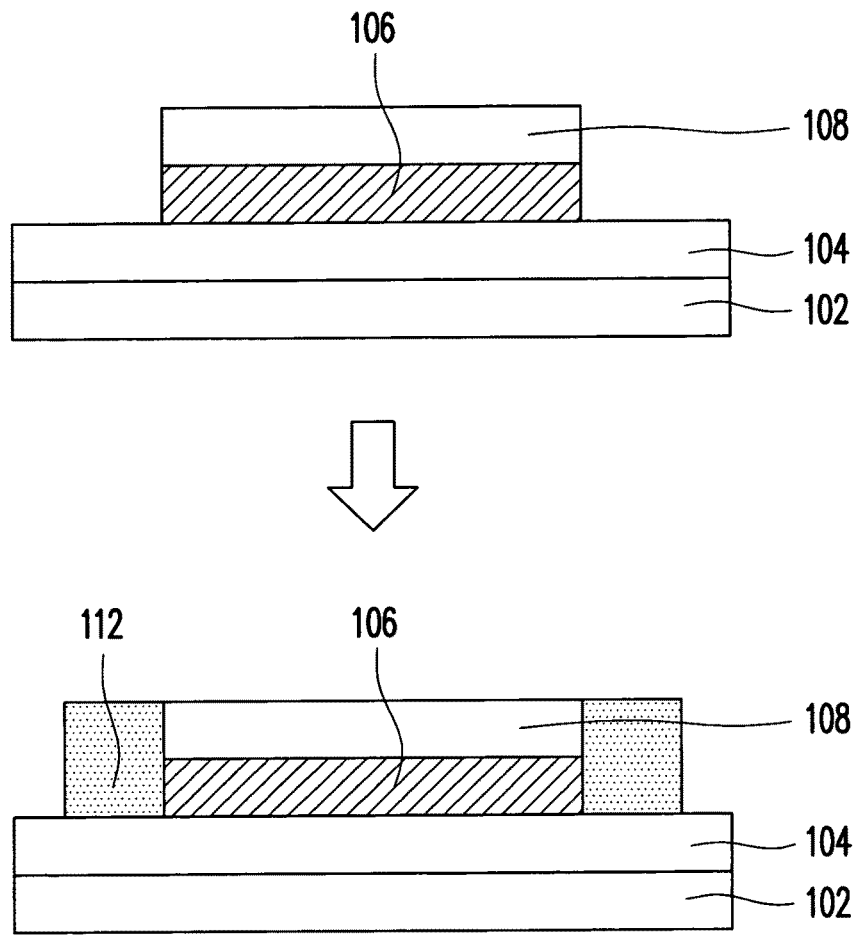
FIG. 17A is a schematic cross-sectional view of a flowchart showing an encapsulant stacking method of a PVB encapsulant material having porous structure and a single-piece crystalline silicon solar cell according to experiment two.

First, a single-piece crystalline silicon solar cell is encapsulated using PVB material, and a method for encapsulation and stacking of the encapsulant material is as shown in FIG. 16, wherein same reference numerals as in FIG. 1 are used to represent the same components. A module encapsulant structure is as shown in FIG. 17A. First, a 4 inch crystalline silicon solar cell 106 is wrapped between the first encapsulant layer 104 and the second encapsulant layer 108 using thermocompression under vacuum, the vacuum time is 30 minutes at a temperature of 145° C., followed by heat pressing for 30 minutes at the same temperature. Then, the PVB with porous structure obtained in experiment one is used as the encapsulant material 112, is disposed as strips having a width of 10 mm on edges of the 4 inch crystalline silicon solar cells 106, and is heat pressed at 100° C. for 1 minute, so as to make the PVB material adhere to the edges of the 4 inch crystalline silicon solar cell 106. The comparison result of the conventional poreless PVB and PVB obtained in experiment one is shown in Table 1.

TABLE 1

| | Voc (V) | Isc (A) | Vmp (V) | Imp (A) | Pmax (W) | Pmax increases after encapsulation | FF (%) |
|---|---|---|---|---|---|---|---|
| 4 inch crystalline silicon solar cell/ conventional PVB | 0.59 | 3.16 | 0.47 | 2.73 | 1.29 | 0 | 69.1 |
| 4 inch crystalline silicon solar cell/ PVB obtained in experiment one | 0.6 | 3.23 | 0.47 | 2.89 | 1.35 | 4.65% | 69.6 |

Referring to Table 1, it is known that the porous PVB generated by experiment one lead to an increase of maximum power output (Pmax) of the crystalline silicon photovoltaic module by 4.65%, while the conventional poreless PVB have no effect on the Pmax of the crystalline silicon photovoltaic module.

Figure 17B:
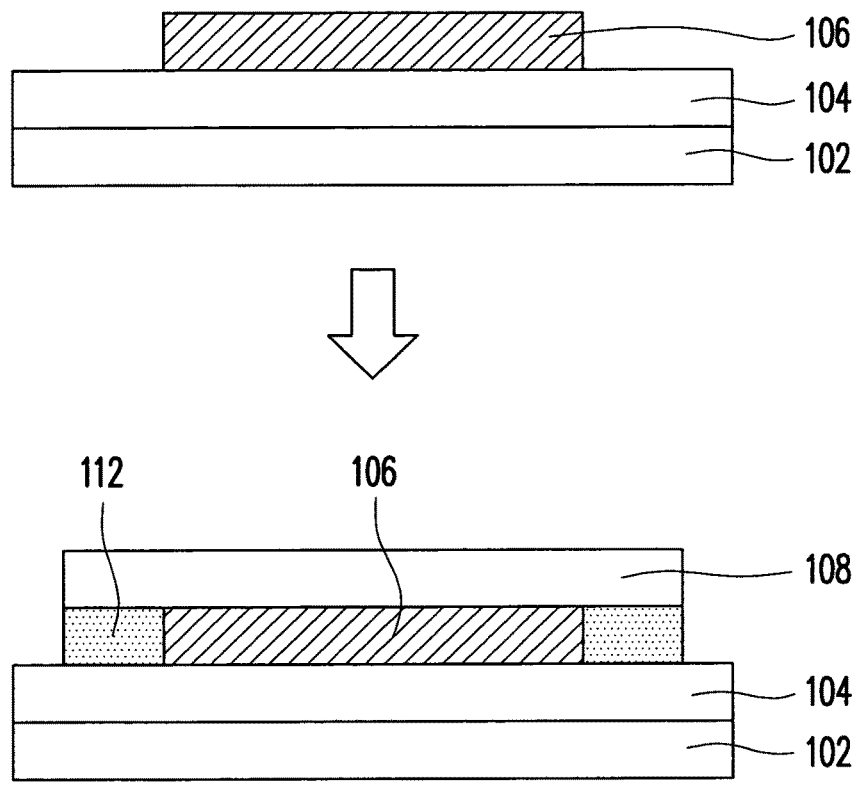
FIG. 17B is a schematic cross-sectional view showing a flowchart of another encapsulant stacking method of a PVB encapsulant material having porous structure and a single-piece crystalline silicon solar cell according to experiment two.

In addition to using a stacking method as referred to FIG. 17A, an alternative module encapsulation method is as shown in FIG. 17B. First the PVB having porous structure (112) is disposed as strips having a width of 10 mm on the edges of the 4 inch crystalline silicon solar cells 106, and then another premelted PVB (used as the second encapsulant material 108) is stuck on top of the solar cell and PVB having porous structure (112). The laminate is heat pressed at 100° C. for 1 minute. According to optical designs, the light confining characteristics will be better by adding a layer of encapsulant material having a higher refractive index on the encapsulant material having porous structure referring to FIG. 17B.

Experiment Three

The PVB having porous structure obtained in experiment one and the conventional pre-melt poreless PVB are used as the encapsulant materials and are respectively disposed on the surface of the back contact of a see-through type amorphous silicon thin film photovoltaic module and are heat pressed at 100° C. for 1 minute, wherein the thin film photovoltaic module includes a glass backsheet having a thickness of 1 mm, the silicon thin film solar cells are arranged in arrays of cells and an area of a single cell is about 0.25 cm$^2$. The layers of the silicon thin film solar cells are a 100 nm thick back electrode transparent conductive layer, a μc-Si silicon thin film (including a 15 nm thick N-type layer, a 1500 nm thick intrinsic layer and a 15 nm thick P-type layer) and a 60 nm thick transparent conductive layer.

Figure 18A:
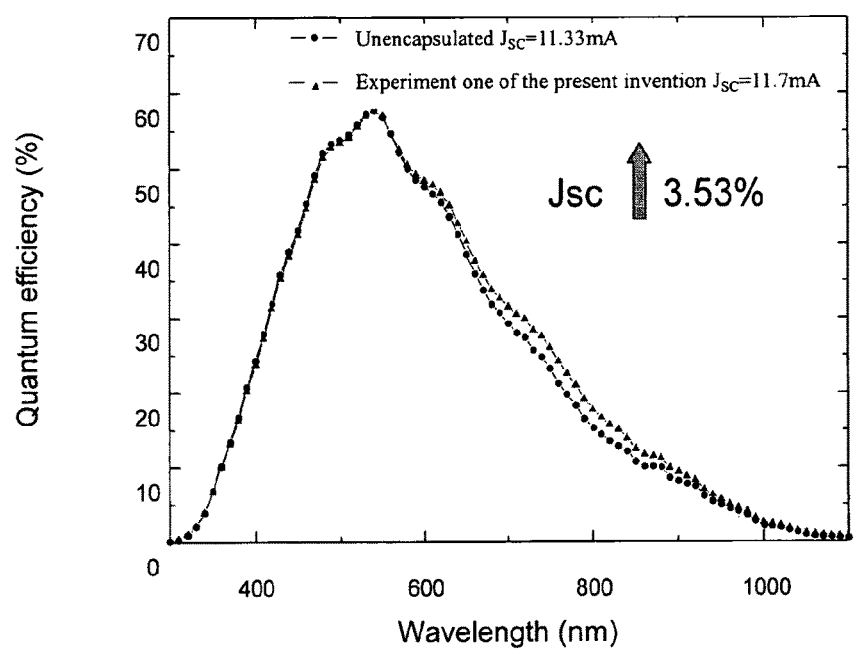
FIG. 18A is a photoelectric conversion efficiency (QE) diagram of an unencapsulated see-through type silicon thin film solar cell module and a see-through type silicon thin film solar cell module using an encapsulant material according to experiment one.
Figure 18B:
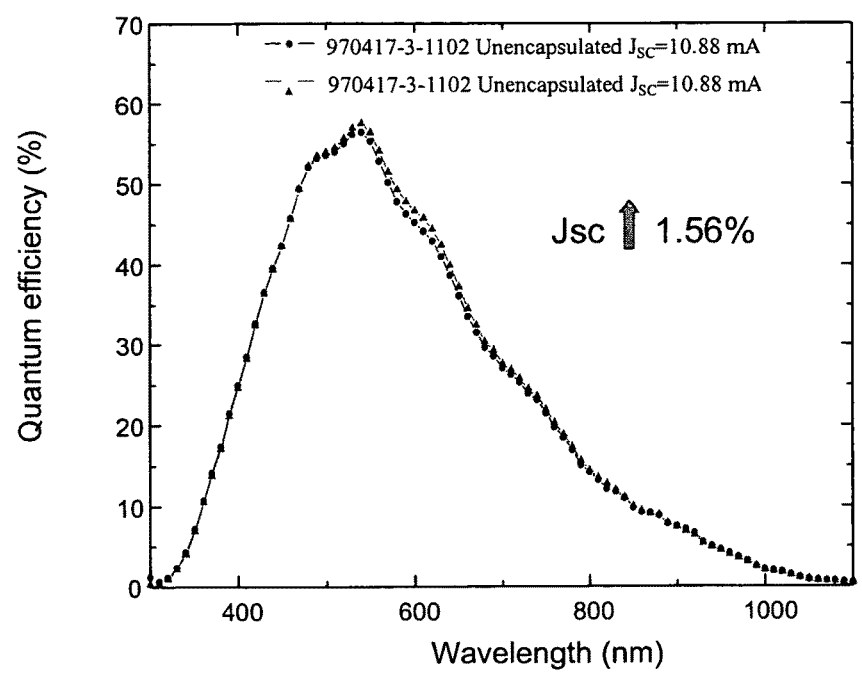
FIG. 18B is a QE diagram of an unencapsulated see-through type silicon thin film solar cell module and a see-through type silicon thin film solar cell module using a conventional encapsulant material which does not have pores.

As a result, short circuit current (Jsc) of the silicon thin film photovoltaic module having the PVB with porous structure obtained in experiment one enhances by 3.53%, referring to FIG. 18A, while Jsc of the silicon thin film photovoltaic module with the conventional poreless PVB only increases by 1.56%, referring to FIG. 18B.

Experiment Four

Figure 19A:
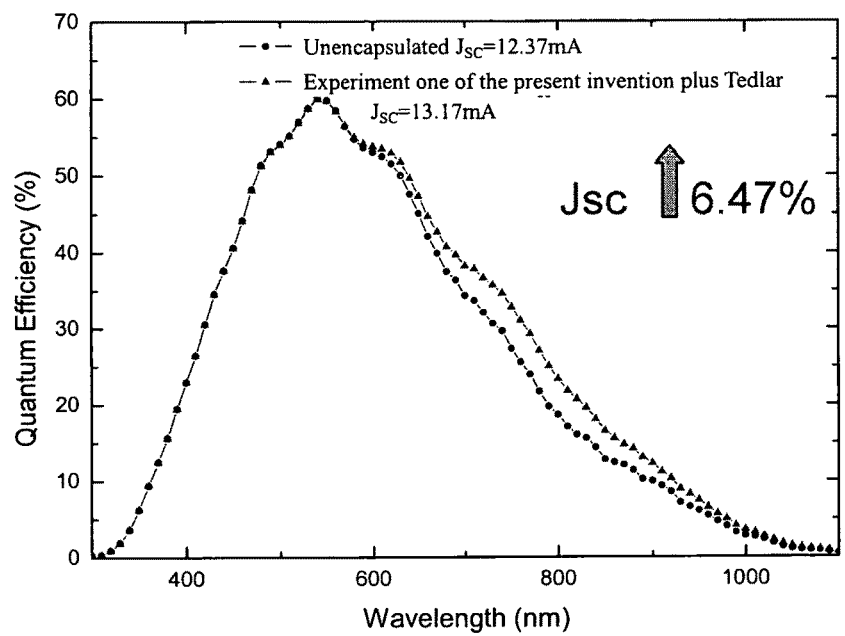
FIG. 19A is a QE diagram of an unencapsulated see-through type silicon thin film solar cell module and a see-through type silicon thin film solar cell module using an encapsulant material of experiment one which has laminated polymer film Tedlar® as backsheet.
Figure 19B:
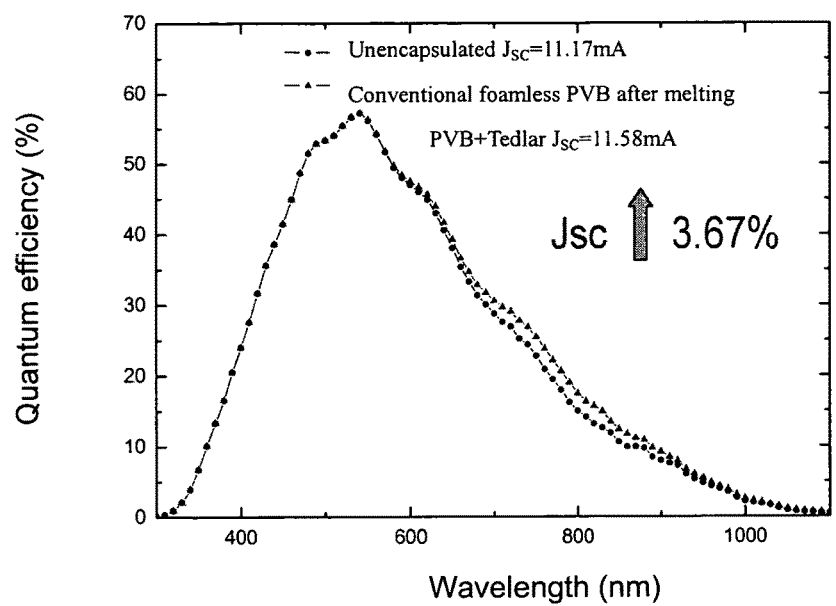
FIG. 19B is a QE diagram of an unencapsulated see-through type silicon thin film solar cell module and a see-through type silicon thin film solar cell module using a conventional PVB encapsulant material which has laminated polymer film Tedlar® as backsheet.

The silicon thin film solar cells as in experiment three are provided, but the PVB material having porous structure is heat pressed to a Tedlar® backsheet for 1 minute. Results show that the high reflectivity of the Tedlar® further enhances the reflectance of the encapsulant material having porous structure. The Jsc of the thin film photovoltaic module having the PVB with porous structure as obtained in experiment one increases by 6.47%, referring to FIG. 19A, while the Jsc of the thin film photovoltaic module having conventional poreless PVB only increases by 3.67%, referring to FIG. 19B.

Therefore, the reflectance characteristic of the present invention is obviously superior than that of the conventional encapsulant material. In addition, besides using PVB as the encapsulant material with porous structure of the present invention, other materials may also be used, for example, in the following experiment five.

Experiment Five

Figure 20:
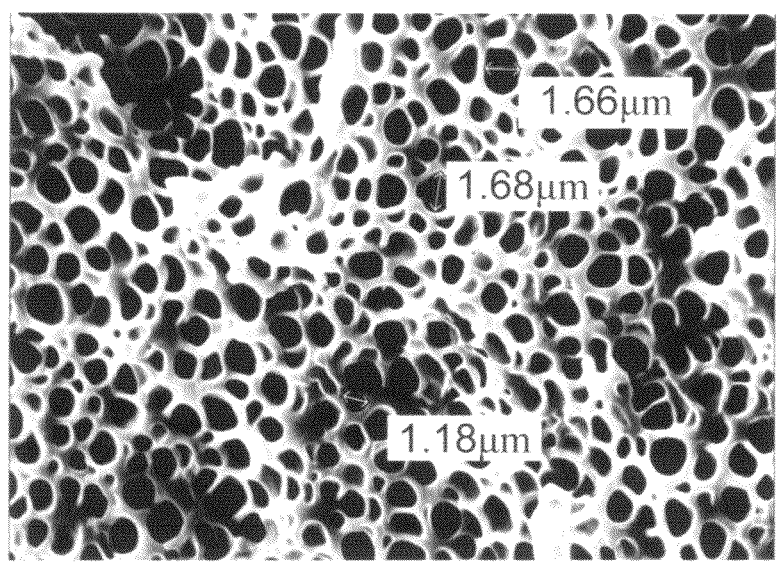
FIG. 20 is a SEM photograph showing ethylene vinyl acetate (EVA) with pores obtained in experiment five.

First, an ethylene vinyl acetate (EVA) film is preheated in the vacuum at a temperature between 100 and 160° C. for 5 to 20 minutes. Then the EVA undergoes supercritical $CO_2$ foaming, under a pressure of 10 to 25 Mpa and at a temperature of 40 to 80° C., the soaking time is between 1 and 5 minutes, depending on thickness sample thickness. FIG. 20 is a SEM photograph showing EVA with pores obtained in experiment five. The foamed EVA is crosslinked with e-beam to cure porous structure of the EVA. The e-beam energy is 600 keV and the irradiation dose is 30 Mrad.

Figure 21:
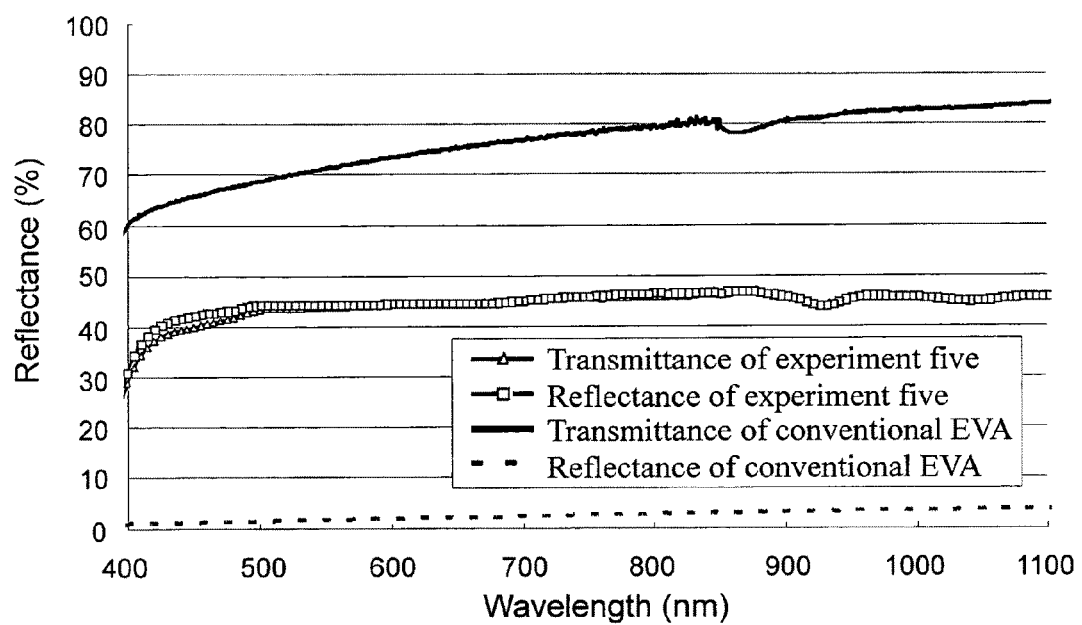
FIG. 21 is a curve showing reflectance and transmittance of EVA having porous structure obtained in experiment five and of conventional EVA.

Then, the EVA is heated at 145° C. for 10 minutes to simulate a photovoltaic module encapsulation process, then the EVA obtained in experiment five is measured for its optical characteristics in comparison with the conventional poreless EVA to obtain FIG. 21, which is a curve showing reflectance and transmittance of EVA having porous structure and that of conventional EVA. Referring to FIG. 21, it is known that the EVA of the present invention maintains light transmittance of about 7% to 45% and has reflectance up to about 45%, which is much higher than a reflectance of 4% to 7% of the conventional poreless EVA, so the EVA of the present invention may be used as an encapsulant material with enhanced reflectance.

Experiment Six

Figure 22:
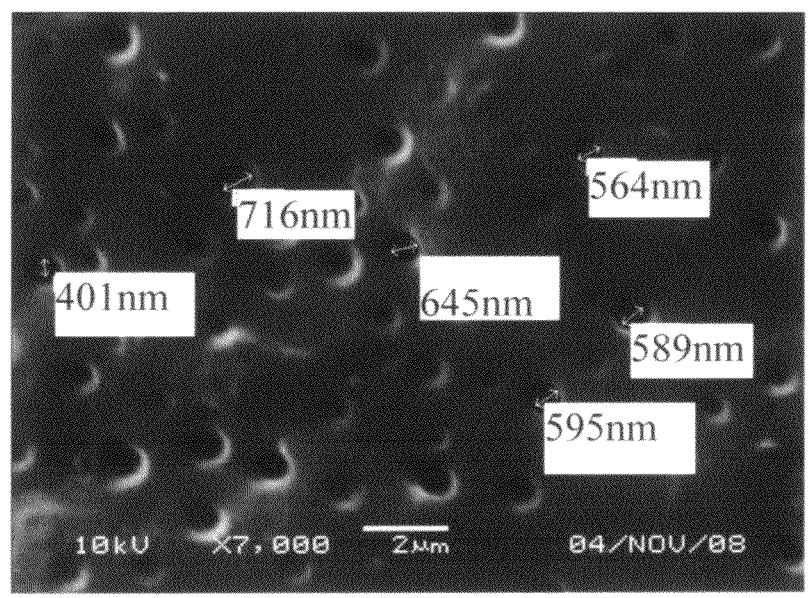
FIG. 22 is a SEM photograph showing EVA having pores obtained in experiment six.

The EVA having porous structure obtained by experiment five and the conventional poreless EVA are used as encapsulant materials, both encapsulants are pre-melted in order to eliminate surface texture, wherein the EVA having porous structure is crosslinked in advance using the e-beam irradiation to cure the structure of the EVA after foaming. The e-beam energy is 600 keV and the irradiation dose is 40 Mrad. Two pieces of 5 inch crystalline silicon solar cells with the same Pmax are selected to for photovoltaic module lamination. The encapsulation structure of the crystalline silicon solar cell is as shown in FIG. 1. First the 5 inch crystalline silicon solar cells 106 are wrapped between the first encapsulant layer 104 and the second encapsulant layer 108, and the EVA material 112 having porous structure obtained by experiment one is disposed on the edges of the crystalline silicon solar cells 106 as 10 mm wide strips, the module is then subjected to the vacuum heating for 6 minutes and to heat pressing for 8 minutes at 145° C. and the result is compared with the 5 inch crystalline silicon solar cell module using conventional EVA encapsulant material. The results shows that the crystalline silicon solar cell module having porous structure encapsulant has a Pmax of 2.222 W, which has a 9.404% power enhancement than that of the conventional crystalline silicon solar cell module with a Pmax of 2.031 W. FIG. 22 is a SEM photograph showing EVA having pores obtained from experiment six.

In summary, the encapsulant material of the present invention has porous structure with enhanced reflectance characteristics, so that when the encapsulant material is applied to a photovoltaic module, the optical path is increased to improve the light absorption of the solar cells, thereby enhancing light confining characteristics of the photovoltaic module. Since the average pore diameter in the encapsulant material is controlled between several hundreds of nanometers to several hundreds of micrometers, the encapsulant material of the present invention maintains the transmittance of about 55% to 93%, and the reflectance thereof is as high as 7% to 45%, which is much higher than the transmittance of 4% to 8% of the conventional poreless encapsulant material. Hence it may be used as the encapsulant material with enhanced reflectivity.

Although the present invention has been described with reference to the above embodiments, application of the present invention is not limited to these embodiments. It will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A crystalline silicon photovoltaic module, comprising a first backsheet, a first encapsulant layer, a plurality of crystalline silicon solar cells, a second encapsulant layer and a transparent substrate sequentially stacked, characterized in that the crystalline silicon photovoltaic module further comprising:

a foamed encapsulant material with porous structure disposed between the backsheet and the transparent substrate, wherein the foamed encapsulant material with porous structure is crosslinked using a chemical or physical crosslinking method, so as to enhance heat resistance of the foamed encapsulant material with porous structure, and a material of the foamed encapsulant material with porous structure comprises ethylene vinyl acetate, polyvinyl butyral, polyolefin, polyurethane or silicone, so as to collect light passing through a gap between the crystalline silicon solar cells and to increase power conversion efficiency of the crystalline silicon photovoltaic module.

2. The crystalline silicon photovoltaic module of claim 1, wherein the foamed encapsulant material with porous structure is an encapsulant material used for encapsulating the crystalline silicon photovoltaic module.

3. The crystalline silicon photovoltaic module of claim 1, wherein the foamed encapsulant material with porous structure is disposed between the crystalline silicon solar cells and between the first encapsulant layer and the second encapsulant layer.

4. The crystalline silicon photovoltaic module of claim 1, wherein the foamed encapsulant material with porous structure is a plastic thin film structure, the plastic thin film structure being a foamable polymeric material disposed between the crystalline silicon solar cells and between the first encapsulant layer and the second encapsulant layer using an additional stacking method.

5. The crystalline silicon photovoltaic module of claim 1, wherein the transparent substrate comprises glass or a plastic substrate.

6. The crystalline silicon photovoltaic module of claim 1, wherein the backsheet comprises a glass or a laminated polymer film.

7. The crystalline silicon photovoltaic module of claim 1, wherein an average pore diameter in the foamed encapsulant material with porous structure is between several hundreds of nanometers and several hundreds of micrometers, so as to enhance light reflectivity of the foamed encapsulant material with porous structure.

8. The crystalline silicon photovoltaic module of claim 1, wherein the chemical crosslinking method comprises peroxide crosslinking or silane crosslinking.

9. The crystalline silicon photovoltaic module of claim 1, wherein the physical crosslinking method comprises e-beam crosslinking or gamma ray crosslinking.

10. The crystalline silicon photovoltaic module of claim 1, wherein light reflectance of the foamed encapsulant material with porous structure is between 7% and 45%.

11. A crystalline silicon photovoltaic module, comprising a first backsheet, a first encapsulant layer, a plurality of crystalline silicon solar cells, and a transparent substrate sequentially stacked, characterized in that the crystalline silicon photovoltaic module further comprising:

a foamed encapsulant material with porous structure disposed between the crystalline silicon solar cells and between the first encapsulant layer and the transparent substrate, wherein the foamed encapsulant material with porous structure is crosslinked using a chemical or physical crosslinking method, so as to enhance heat resistance of the foamed encapsulant material with porous structure, and a material of the foamed encapsulant material with porous structure comprises ethylene vinyl acetate, polyvinyl butyral, polyolefin, polyurethane or silicone, so as to collect light passing through a gap between the crystalline silicon solar cells and to increase power conversion efficiency of the crystalline silicon photovoltaic module.

12. The crystalline silicon photovoltaic module of claim 11, wherein the transparent substrate comprises glass or a plastic substrate.

13. The crystalline silicon photovoltaic module of claim 11, wherein the backsheet comprises a glass or a laminated polymer film.

14. The crystalline silicon photovoltaic module of claim 11, wherein an average pore diameter in the foamed encapsulant material with porous structure is between several hundreds of nanometers and several hundreds of micrometers, so as to enhance light reflectivity of the foamed encapsulant material with porous structure.

15. The crystalline silicon photovoltaic module of claim 11, wherein the chemical crosslinking method comprises peroxide crosslinking or silane crosslinking.

16. The crystalline silicon photovoltaic module of claim 11, wherein the physical crosslinking method comprises e-beam crosslinking or gamma ray crosslinking.

17. The crystalline silicon photovoltaic module of claim 11, wherein light reflectance of the foamed encapsulant material with porous structure is between 7% and 45%.

* * * * *